United States Patent
Dorris et al.

(10) Patent No.: US 7,055,745 B2
(45) Date of Patent: *Jun. 6, 2006

(54) LASER SCANNING METHOD AND SYSTEM EMPLOYING VISIBLE SCANNING-ZONE INDICATORS IDENTIFYING A THREE-DIMENSIONAL OMNI-DIRECTIONAL LASER SCANNING VOLUME FOR PACKAGE TRANSPORT

(75) Inventors: R. Monroe Dorris, Fort Washington, PA (US); Thomas Amundsen, Turnersville, NJ (US); LeRoy Dickson, Leeds, UT (US); Nancy A. Smith, Sicklerville, NJ (US)

(73) Assignee: Metrologic Instruments, Inc., Blackwood, NJ (US)

( * ) Notice: Subject to any disclaimer, the term of this patent is extended or adjusted under 35 U.S.C. 154(b) by 45 days.

This patent is subject to a terminal disclaimer.

(21) Appl. No.: 10/636,306

(22) Filed: Aug. 7, 2003

(65) Prior Publication Data

US 2005/0098631 A1    May 12, 2005

Related U.S. Application Data

(63) Continuation of application No. 09/681,606, filed on May 7, 2001, now Pat. No. 6,629,640, application No.

(Continued)

(51) Int. Cl.
*G06K 7/10* (2006.01)

(52) U.S. Cl. ............... 235/462.01; 235/462.25; 235/472.01

(58) Field of Classification Search ................. 235/462.01–462.48, 472.01, 472.02, 472.03, 235/454, 455, 494, 470, 375, 383, 456, 432
See application file for complete search history.

(56) References Cited

U.S. PATENT DOCUMENTS 4,026,630 A    5/1977    Wollenmann (Continued)

FOREIGN PATENT DOCUMENTS

| WO | WO 97/22945 | 6/1997 |
|---|---|---|
| WO | WO 99/49411 | 9/1999 |
| WO | WO 00/75856 | 12/2000 |

*Primary Examiner*—Thien M. Le
(74) *Attorney, Agent, or Firm*—Thomas J. Perkowski, Esq., P.C.

(57) ABSTRACT

A method of and system for automatically identifying packages during manual package sortation operations, wherein, a laser scanning system is supported above a workspace environment of 3-D spatial extent, which can be occupied by a human operator involved in the manual sortation of packages bearing bar code symbols. During operation of the system, a laser scanning pattern generator projects an omni-directional laser scanning pattern that spatially encompasses a substantial portion of the workspace environment, through which packages are transported during sorting operations. A visible scanning-zone indication pattern is projected onto the floor surface immediately beneath the omni-directional laser scanning pattern. As the human operator uses the visible scanning-zone pattern to guide the transport of a package bearing a bar code symbol through the workspace environment, the package is automatically identified by the laser scanning system supported above the workspace environment.

18 Claims, 9 Drawing Sheets

Related U.S. Application Data

10/636,306, and a continuation of application No. 09/551,887, filed on Apr. 18, 2000, now Pat. No. 6,758,402, application No. 10/636,306, and a continuation of application No. 09/505,239, filed on Feb. 16, 2000, now Pat. No. 6,517,001, application No. 10/636,306, and a continuation of application No. 09/505,238, filed on Feb. 16, 2000, now Pat. No. 6,530,522, which is a continuation-in-part of application No. 09/479,780, filed on Jan. 7, 2000, now Pat. No. 6,561,424, and a continuation of application No. 09/442,718, filed on Nov. 18, 1999, now Pat. No. 6,481,625, and a continuation of application No. 09/305,896, filed on May 5, 1999, now Pat. No. 6,287,946, and a continuation of application No. 09/275,518, filed on Mar. 24, 1999, now Pat. No. 6,457,642, and a continuation of application No. 09/274,265, filed on Mar. 22, 1999, now Pat. No. 6,382,515, and a continuation of application No. 09/243,078, filed on Feb. 2, 1999, now Pat. No. 6,354,505, and a continuation of application No. 09/157,778, filed on Sep. 21, 1998, now Pat. No. 6,517,004, and a continuation of application No. 09/047,146, filed on Mar. 24, 1998, now Pat. No. 6,360,947, which is a continuation of application No. 08/949,915, filed on Oct. 14, 1997, now Pat. No. 6,158,659, which is a continuation of application No. 08/940,561, filed on Sep. 30, 1997, now Pat. No. 6,112,990, which is a continuation of application No. 08/854,832, filed on May 12, 1997, now Pat. No. 6,085,978, which is a continuation of application No. 08/886,806, filed on Apr. 22, 1997, now Pat. No. 5,984,185, which is a continuation of application No. 08/573,949, filed on Dec. 18, 1995, now abandoned.

U.S. PATENT DOCUMENTS

| | | | |
|---|---|---|---|
| 4,224,509 A | 9/1980 | Cheng | |
| 4,415,224 A | 11/1983 | Dickson | |
| 4,416,505 A | 11/1983 | Dickson | |
| 4,593,967 A | 6/1986 | Haugen | |
| 4,603,262 A | 7/1986 | Eastman et al. | |
| 4,647,143 A | 3/1987 | Yamazaki et al. | |
| 4,689,480 A | 8/1987 | Stern | |
| 4,748,316 A | 5/1988 | Dickson | |
| 4,790,612 A | 12/1988 | Dickson | |
| 4,794,237 A | 12/1988 | Ferrante | |
| 4,800,256 A | 1/1989 | Brookkman et al. | |
| 4,904,034 A | 2/1990 | Narayan et al. | |
| 5,296,689 A | 3/1994 | Reddersen et al. | |
| 5,378,883 A | 1/1995 | Batterman et al. | |
| 5,446,529 A | 8/1995 | Stettner et al. | |
| 5,600,119 A | 2/1997 | Dvorkis et al. | |
| 5,659,167 A | 8/1997 | Wang et al. | |
| 5,783,811 A | 7/1998 | Feng et al. | |
| 5,786,586 A | 7/1998 | Pidhirny et al. | |
| 5,793,033 A | 8/1998 | Feng et al. | |
| 5,834,754 A | 11/1998 | Feng et al. | |
| 5,842,577 A * | 12/1998 | Stevens et al. | 209/3.3 |
| 5,949,057 A | 9/1999 | Feng | |
| 5,984,185 A | 11/1999 | Dickson et al. | |
| 6,045,047 A | 4/2000 | Pidhirny et al. | |
| 6,060,722 A | 5/2000 | Havens et al. | |
| 6,062,481 A * | 5/2000 | Storch et al. | 235/494 |
| 6,073,846 A | 6/2000 | Dickson et al. | |
| 6,085,978 A | 7/2000 | Knowles et al. | |
| 6,158,659 A | 12/2000 | Dickson et al. | |
| 6,168,081 B1 * | 1/2001 | Urano et al. | 235/462.27 |
| 6,223,986 B1 | 5/2001 | Bobba et al. | |
| 6,223,988 B1 | 5/2001 | Batterman | |
| 6,267,296 B1 * | 7/2001 | Ooshima et al. | 235/487 |
| 6,328,215 B1 | 12/2001 | Dickson et al. | |
| 6,330,974 B1 | 12/2001 | Ackley | |
| 6,340,114 B1 | 1/2002 | Correa et al. | |
| 6,347,163 B1 | 2/2002 | Roustaei | |
| 6,629,640 B1 * | 10/2003 | Dorris et al. | 235/462.01 |
| 6,681,994 B1 | 1/2004 | Koenck | |
| 6,830,190 B1 * | 12/2004 | Lucera et al. | 235/462.25 |
| 2002/0104782 A1 * | 8/2002 | DeWitt et al. | 209/3.3 |

* cited by examiner

LASER SCANNING METHOD AND SYSTEM EMPLOYING VISIBLE SCANNING-ZONE INDICATORS IDENTIFYING A THREE-DIMENSIONAL OMNI-DIRECTIONAL LASER SCANNING VOLUME FOR PACKAGE TRANSPORT

CROSS REFERENCE TO RELATED APPLICATIONS

This is Application is a continuation of application Ser. No. 09/681,606 filed on May 7, 2001 now U.S. Pat. No. 6,629,640, which is a Continuation-in-Part of U.S. application Ser. No. 09/479,780 filed Jan. 7, 2000 now U.S. Pat. No. 6,561,424, which is a Continuation of U.S. application Ser. No. 08/940,561 filed Sep. 30, 1997, now U.S. Pat. No. 6,112,990, which is a Continuation of U.S. application Ser. No. 08/886,806 filed Apr. 22, 1997, now U.S. Pat. No. 5,984,185, which is a Continuation of U.S. application Ser. No. 08/573,949 filed Dec. 18, 1995, now abandoned; U.S. application Ser. No. 09,505,239 filed Feb. 16, 2000 now U.S. Pat. No. 6,517,001, which is a continuation of U.S. application Ser. No. 08/854,832 filed May 12, 1997, now U.S. Pat. No. 6,085,978, U.S. application Ser. No. 09/505, 238 filed Feb. 16, 2000 now U.S. Pat. No. 6,530,522, which is a Continuation of U.S. application Ser. No. 08/949,915 filed Oct. 14, 1997, now U.S. Pat. No. 6,158,659; U.S. application Ser. No. 09/047,146 filed Mar. 24, 1998 now U.S. Pat. No. 6,360, 947; U.S. application Ser. No. 09/157, 778 filed Sep. 21, 1998 now U.S. Pat. No. 6,517,004; U.S. application Ser. No. 09/274,265 filed Mar. 22, 1999 now U.S. Pat. No. 6,382,515; U.S. application Ser. No. 09/275, 518 filed Mar. 24, 1999 now U.S. Pat. No. 6,457,642; U.S. application Ser. No. 09/305,896 filed May 5, 1999 Now U.S. Pat. No. 6,287,946; U.S. patent application Ser. No. 09/243, 078 filed Feb. 2, 1999 now U.S. Pat. No. 6,354,505, U.S. application Ser. No. 09/442,718 filed Nov. 18, 1999 now U.S. Pat. No. 6,481,625, and U.S. application Ser. No. 09/551,887 filed Apr. 18, 2000 now U.S. Pat. No. 6,758,402.

BACKRGROUND OF INVENTION

1. Field of Invention

The present invention relates to holographic laser scanning systems that produce an omni-directional scanning pattern in a three-dimensional (3-D) scanning volume wherein users manually transport an object through the 3-D scanning volume to detect physical attributes of the object (such as detecting and decoding bar code symbols on surfaces of the object).

2. Brief Description of the Prior Art

Handheld laser scanning systems typically form a single scan line which must be properly aimed over the surface of its intended target object. Handheld laser scanners such as those described in U.S. Pat. Nos. 4,603,262 and 5,296,689 were developed that used a pointer beam (or aiming light) which is visible over the intended scan distance to aid the user in aiming the handheld scanner (or orienting the target object).

Polygonal laser scanning systems generate a multi-directional scan pattern forming a scan volume which is typically not well-defined. U.S. Pat. No. 6,223,986 discloses a polygonal laser scanning system that employs a laser light source to generate a visible target (or image) in the scan volume at a preferred location for placement of the article to be scanned.

Handheld laser scanning systems and polygonal laser scanning systems are typically limited to scanning applications that require a small scan volume (because it is cost-prohibitive to use such systems to omni-directionally scan a large scan volume).

In contrast, laser scanning systems employing holographic optical elements can be cost-effectively designed and manufactured to produce an omni-directional pattern through a large well-defined scanning volume (preferably with multiple scanning beams with varying depths of field in the scanning volume). The present inventors have recognized the potential to facilitate scanning in 3-D omni-directional holographic laser scanning systems.

In 3-D omni-directional holographic laser scanning systems, such as Metrologic's HoloTrak® scanner products, it is often difficult for users to locate the position of the 3-D scanning volume (and the 3-D omni-directional scan pattern therein) without looking directly into the scanner and thus exposing the user's eyes to potentially (or assumed) harmful laser scanning beams. The reason that the 3-D scanning volume (and the 3-D omni-directional scan pattern therein) is not readily visible is due to the high speed of the scanning beams and its relatively low intensity compared to ambient light.

When a user of such a system is required to manually transport an object through the 3-D scanning volume (and the 3-D omni-directional scanning pattern therein) to detect physical attributes of the object (such as detecting and decoding bar code symbols on surfaces of the object), unwanted scanning errors occur in the event that the user is unable to identify the correct location of the 3-D scanning volume (and the omni-directional scan pattern therein) when attempting to transport the object through the 3-D scan volume. Such unwanted scanning errors limit the productivity of the user. Moreover, any time taken by a user in locating the 3-D scanning volume limits the productivity of the user. Such limitations in user productivity represent increased costs associated with the use of the laser scanning system. In addition, a user repetitively searching for the 3-D scanning volume of the system can potentially lead to repetitive motion strain and injury Thus, there is a great need in the art for an improved holographic laser scanning system that enables users to efficiently locate the 3-D scanning volume (and the 3-D omni-directional scan pattern therein) of the 3-D omni-directional laser scanning system, while avoiding the shortcomings and drawbacks of prior art holographic scanning systems and methodologies.

SUMMARY OF INVENTION

Accordingly, a primary object of the present invention is to provide a novel 3-D omni-directional holographic laser scanning-system that is free of the shortcomings and drawbacks of prior art laser scanning systems and methodologies.

Another object of the present invention is to provide a 3-D omni-directional holographic laser scanning system that provides visible indicia, visibly discernable by users of the system, characterizing the location of the 3-D scanning volume (and the 3-D omni-directional scan pattern therein) of the system, relative to the physical environment in which the system is installed and operated.

Another object of the present invention is to provide a 3-D omni-directional holographic laser scanning system that provides visible indicia characterizing the approximate location of the center, edges or other portion of the 3-D scanning volume (and the 3-D omni-directional scan pattern therein) of the system.

Another object of the present invention is to provide a 3-D omni-directional holographic laser scanning system that utilizes low cost materials to provide visible indicia characterizing the location of the 3-D scanning volume (and the 3-D omni-directional scan pattern therein) of the system.

Another object of the present invention is to provide a 3-D omni-directional holographic laser scanning system that utilizes a visible light pattern, which is preferably distinguishable from the scanning beam(s) of the system, to provide visible indicia characterizing the location of the 3-D scanning volume (and the 3-D omni-directional scan pattern therein) of the 3-D omni-directional laser scanning system.

Another object of the present invention is to provide a 3-D omni-directional holographic laser scanning system that utilizes a readily-discernable visible light pattern to provide visible indicia characterizing the location of the 3-D scanning volume (and the 3-D omni-directional scan pattern therein) of the system.

Another object of the present invention is to provide a 3-D omni-directional holographic laser scanning system that shines a visible light pattern on a surface over which the objects are moved through the 3-D scanning volume to provide a visible indication of points substantially corresponding to the boundary of the projection of the 3-D scanning volume (and the 3-D omni-directional scan pattern therein) onto the surface.

A further object of the present invention is to provide a 3-D omni-directional holographic laser scanning system that uses the same laser scanning beam(s) to detect properties of surfaces passing through a 3-D scanning volume and to provide visible indicia characterizing a location of the 3-D scanning volume (and the 3-D omni-directional scan pattern therein) of the system.

A further object of the present invention is to provide a 3-D omni-directional holographic laser scanning system that provides visible indicia characterizing a location of the 3-D scanning volume (and the 3-D omni-directional scan pattern therein) of the system and provides an indication that the user has entered a region corresponding to the 3-D scanning volume.

These and other objects of the present invention will become apparent hereinafter and in the Claims to Invention.

BRIEF DESCRIPTION OF DRAWINGS

For a more complete understanding of the present invention, the following Detailed Description of the Illustrative Embodiment should be read in conjunction with the accompanying Drawings, wherein.

DETAILED DESCRIPTION

Figure 1:
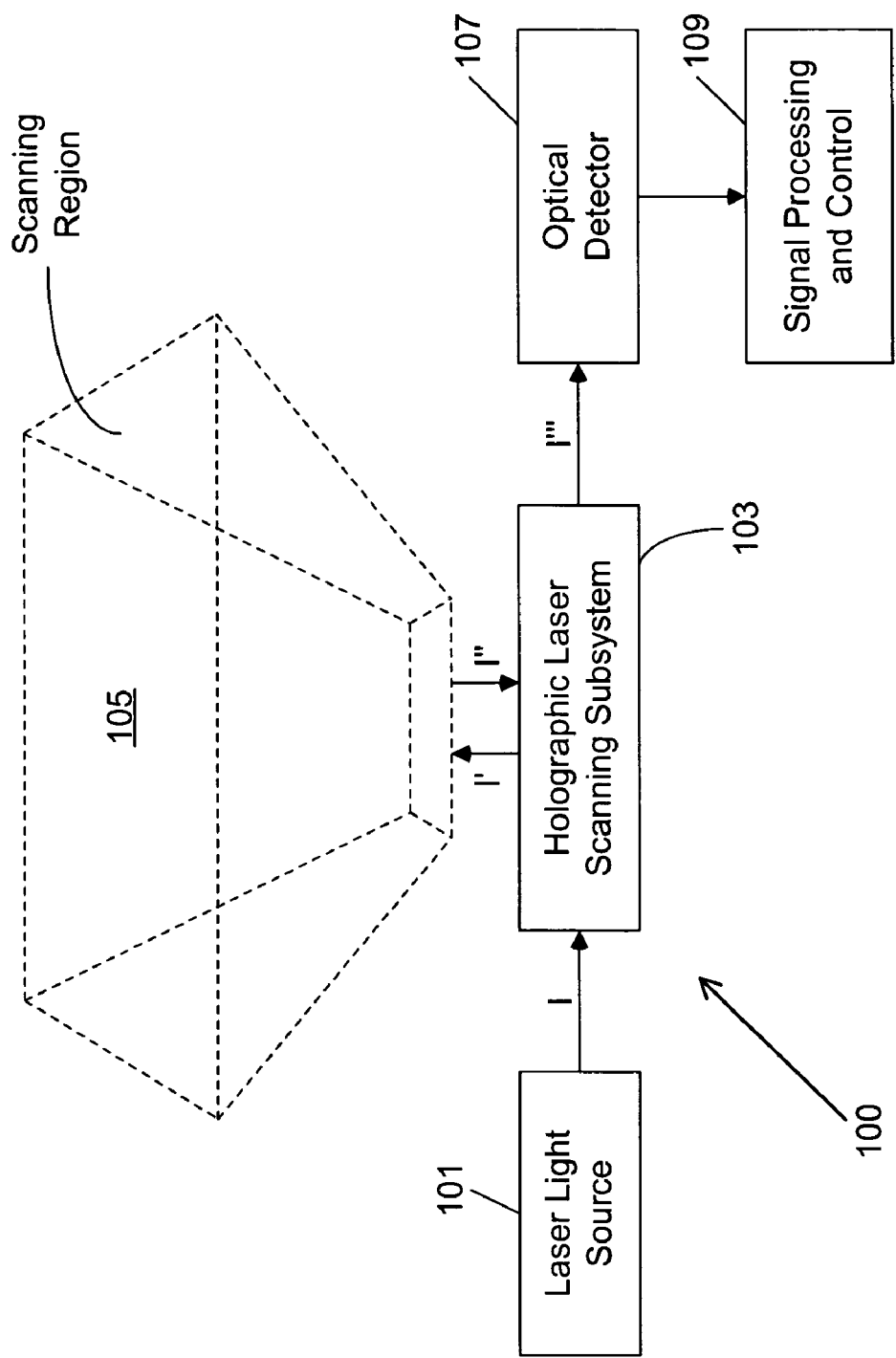
FIG. 1 is a schematic illustration of a 3-D omni-directional holographic laser scanning system 100 wherein a laser light source 101 (such as a VLD) emits laser light beams (denoted l); a holographic laser scanning subsystem 103 utilizes a plurality of holographic optical elements (preferably supported on a rotating disc) to direct portions (denoted l') of these laser light beams to create a 3-D omni-directional scan pattern that defines a 3-D scanning volume 105; portions of the returning (i.e., incoming) laser light beams (denoted l") from the 3-D scanning volume 105, are collected by the subsystem 103 and portions (denoted l''') of the collected light are directed to photodetector(s) 107 and signal processing and control circuitry 109 that capture and analyze the collected light to identify properties (such as bar code symbols) of surfaces (or objects) within the 3-D scanning volume 105.

Referring to the figures in the accompanying Drawings, the various illustrative embodiments of the improved laser scanning system (and components therein) of the present invention will be described in great detail, wherein like elements will be indicated using like reference numerals.

Figure 2A:
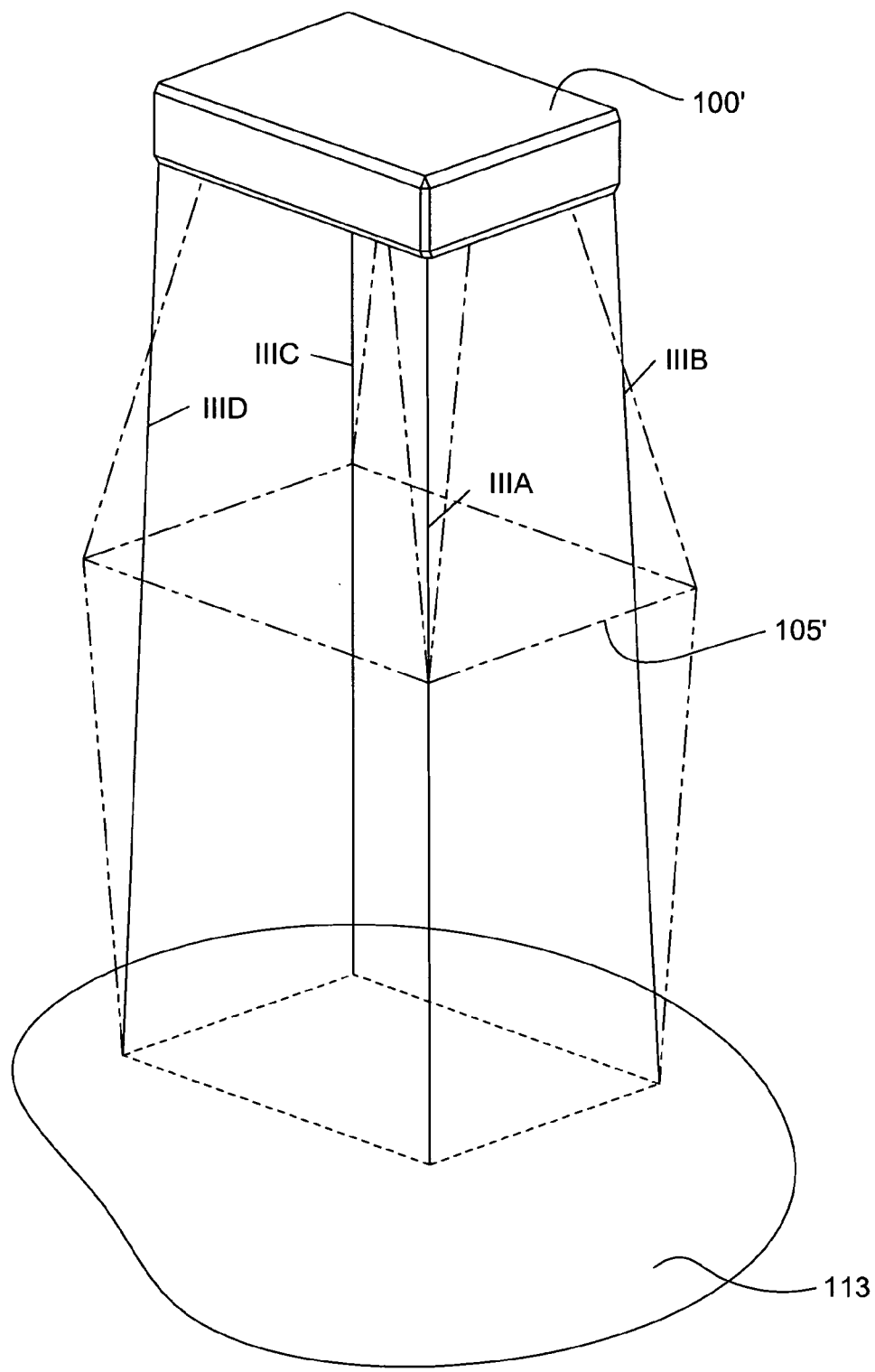
FIG. 2(A) is a perspective front view of an illustrative embodiment of an overhead 3-D omni-directional holographic laser scanning system 100' according to the present invention, including one or more light beams (4 shown as 111A, 111B, 111C and 111D) that provide a visible light pattern characterizing the location of the 3-D scanning volume 105' (and the 3-D omni-directional scan pattern therein) of the system 100'.
Figure 2B:
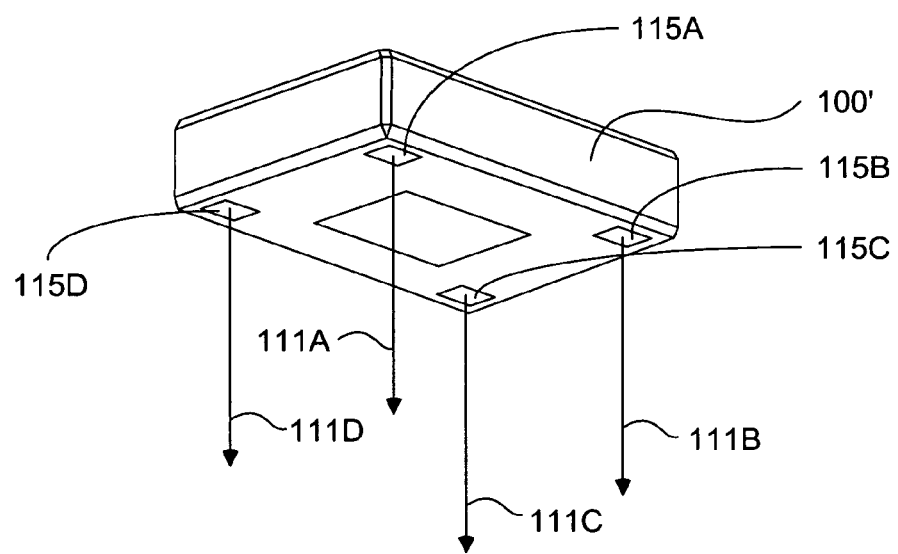
FIG. 2(B) is a perspective bottom view of the overhead 3-D omni-directional holographic laser scanning system 100' of FIG. 2(A) including at least one light production module (4 modules shows as 115A, 115B, 115C and 115D) mounted to the bottom of the housing of the system 100' that provides the visible light pattern (for example, the four visible light beams 111A, 111B, 111C and 111D as shown) characterizing the location of the 3-D scanning volume 105' (and the 3-D omni-directional scan pattern therein) of the system 100'.

FIG. 1 is a schematic illustration of a 3-D omni-directional holographic laser scanning system 100 including a laser light source 101 (such as a VLD) that emits laser light beams (denoted l). A holographic laser scanning subsystem 103 utilizes a plurality of holographic optical elements (preferably supported on a rotating disc) to direct portions (denoted l') of these laser light beams thereby creating an omni-directional scan pattern that defines a 3-D scanning volume 105. Portions of returning (i.e., incoming) light rays (denoted l") from the 3-D scanning volume 105, which reflect off light reflective surfaces in the 3-D scanning volume 105, are collected by the optical subsystem 103 and portions (denoted l''') of these returning light rays are directed to photodetector(s) 107 and signal processing and control circuitry 109 that capture and analyze the returning laser light ray portions to identify properties (such as bar code symbols and/or images) of surfaces (or objects) within the 3-D scanning volume 105. Preferably, the omni-directional scan pattern produced by the holographic laser scanning system 100 includes different multi-directional scan patterns at varying focal zones (e.g., focal planes) within the 3-D scanning volume 105. Moreover, such multiple focal zones may cover a depth of field greater than one foot (and preferably cover a depth of field greater than one meter). In addition, the 3-D scanning volume 105 of the omni-directional scan pattern produced by the holographic laser scanning system 100 is preferably well-defined (for example, characterized by a well-defined boundary comprised of substantially planar polygonal surfaces as illustrated in FIGS. 2(A) and 2(B)).

In a preferred embodiment, the improved omni-directional holographic laser scanning system of the present invention includes a mechanism for automatically generating visible indicia (i.e., visible scanning-zone indicators) characterizing the location of the 3-D scanning volume (and the 3-D omni-directional scanning pattern therein), and thus serving to help the user navigate the manual transport of a package therethrough during automatic identification (Auto-ID) operations carried out in a work environment. In general, the production of visible scanning zone indicators may be realized by using one or more visible light beams (visibly discernable to users of the system) which provide a visible light pattern characterizing the location of the 3-D scanning volume (and the 3-D omni-directional scanning pattern therein) generated by the system.

Alternatively, although less preferable in particular applications, such visible indicia may be realized by visible markings (visibly discernable to users of the system), such as reflective paint or reflective tape, affixed to a surface beneath the omni-directional 3-D laser scanning system and in such a manner that characterizes location of the 3-D scanning volume (and the 3-D omni-directional scanning pattern therein) of the system.

Such scanning-zone indicators may specify the location of the 3-D scanning volume (and the 3-D omni-directional scanning pattern therein) by providing an indication of the approximate location of the center of the 3-D scanning volume, of one or more edges of the 3-D scanning volume, and/or any other portion of the scanning volume. Such visible indicia enable users to quickly identify the correct location of the 3-D omni-directional scan pattern therein when attempting to transport the object through the 3-D scanning volume, thus limiting unwanted scanning errors and increasing the productivity of the user, which represents decreased costs associated with the use of the system. Moreover, such features can potentially avoid repetitive motion strain and injury due to users repetitively searching for location of the 3-D scanning volume during manual transport of a package therethrough during automatic identification (Auto-ID) operations carried out in a work environment.

FIGS. 2(A) and (B) illustrate an exemplary embodiment of an overhead (i.e. walk-under) 3-D omni-directional holographic laser scanning system 100' according to the present invention which includes a mechanism for automatically generating one or more visible light beams (for example, 4 visible light beams 111A, 111B, 111C and 111D as shown) that produce a visible light pattern (i.e. scanning-zone indicator pattern) which characterizes the location (and general spatial boundaries) of a 3-D scanning volume 105' (and the 3-D omni-directional scanning pattern therein) generated from the system 100'. In this walk-under configuration, the 3-D omni-directional holographic laser scanning system 100' is stationarily mounted above a work environment. The 3-D scanning volume (and the 3-D omni-directional scanning pattern therein) projects downward toward a surface to scan objects (e.g., packages) that are moved under human control over the surface.

In this configuration, the visible light pattern produced by the visible light beams may characterize location (and general spatial boundaries) of the 3-D scanning volume (and the 3-D omni-directional scanning pattern therein) by providing an indication of the approximate location of the edges of the 3-D scanning volume (and the 3-D omni-directional scanning pattern therein) as shown. In addition, the shining of the visible light pattern onto the surface 113 over which the objects (e.g., packages) are manually transported by a human through the 3-D scanning volume 105' provides a visible indication of points substantially corresponding to the boundary of the projection of the 3-D scanning volume 105' (and the 3-D omni-directional scanning pattern therein) onto the surface 113. Alternatively, the visible light pattern produced by the one or more visible light beams may characterize location (and general spatial boundaries) of the 3-D scanning volume (and the 3-D omni-directional scanning pattern therein) by providing an indication of the approximate location of the center of the 3-D scanning volume and/or of any other portion of the 3-D scanning volume of the system 100'.

As shown in FIG. 2(B), the visible light beams may be produced by one or more light production modules (for example, 4 light production modules 115A, 115B, 115C, 115D) mounted to the exterior bottom of the housing of the overhead holographic laser scanning system 100'. Alternatively, the laser light production modules may be mounted within the interior of the housing of the overhead holographic laser scanning system and projected through a window in the housing. The one or more light production modules produce and direct at least one visible light beam (for example, the 4 visible light beams 111A, 111B, 111C and 111D as shown) to thereby construct the visible light pattern characterizing location of the 3-D scanning volume 105' (and the 3-D omni-directional scanning pattern therein) below the laser scanning system 100'. The light production modules may utilize a visible laser light source (such as a VLD), a light-emitting diode or a white light source to generate the visible light. Preferably, the one or more visible light beams that make up the visible light pattern are distinguishable by brightness, color or both with respect to the laser light used by the laser scanning system 100' in scanning the 3-D scanning volume 105'.

In this illustrative embodiment, the system 100' may utilize collimating (e.g., focusing) elements and possibly other optical elements to generate and direct visible light to thereby produce the visible light pattern constituting the scanning zone indictors which help human operators accurately navigate packages and other bar-coded objects through the 3-D scanning volume during package transport operations. For example, multiple visible light beams-may be generated by a single visible light source in cooperation with a beam splitter.

In addition, the one or more visible light beams that make up the visible light pattern may be pulsed (for aiding its visibility or for compliance with laser safety standards). In such instances, the visible light beams are preferably pulsed at a frequency less than the critical flicker frequency to improve the visibility of the visible light pattern to potential users. The critical flicker frequency is the point at which the one or more flickering visible light beam are no longer perceived as periodic but shifts to continuous.

In this illustrative embodiment, the 3-D omni-directional holographic laser scanner may utilize one or more laser light sources (e.g., VLDs) having characteristic wavelength(s) in producing the omni-directional laser scanning beams together with one or more matched optical filters that enable such characteristic wavelength(s) of light to pass therethrough to the photodetector(s) 107 (while substantially blocking light outside such characteristic wavelength(s) from reaching the photodetector(s) 107), thereby minimizing the ambient noise that reaches the photodetector(s) 107. Such ambient noise, if left unblocked, potentially may interfere with the signal processing functions (and, possibly the bar-code symbol decoding functions) applied to the output of the photodetector(s) 107. In such a system, in the event that one or more laser light sources (e.g., VLDs) are used to generate the visible light pattern that characterizes location of the 3-D scanning volume (and the 3-D omni-directional scanning pattern therein), the characteristic wavelength of such laser light sources (e.g., VLDs) is preferably different from the characteristic wavelength(s) of the laser light source(s) used to produce the 3-D omni-directional scanning pattern. With this design, the optical filters will substantially block any noise produced from the laser light sources (e.g., VLDs) that are used to generate the visible light beams that characterize location of the 3-D scanning volume (and the 3-D omni-directional scanning pattern therein) from reaching the photodetector(s) 107), thereby minimizing the noise that reaches the photodetector(s) 107.

Figure 3:
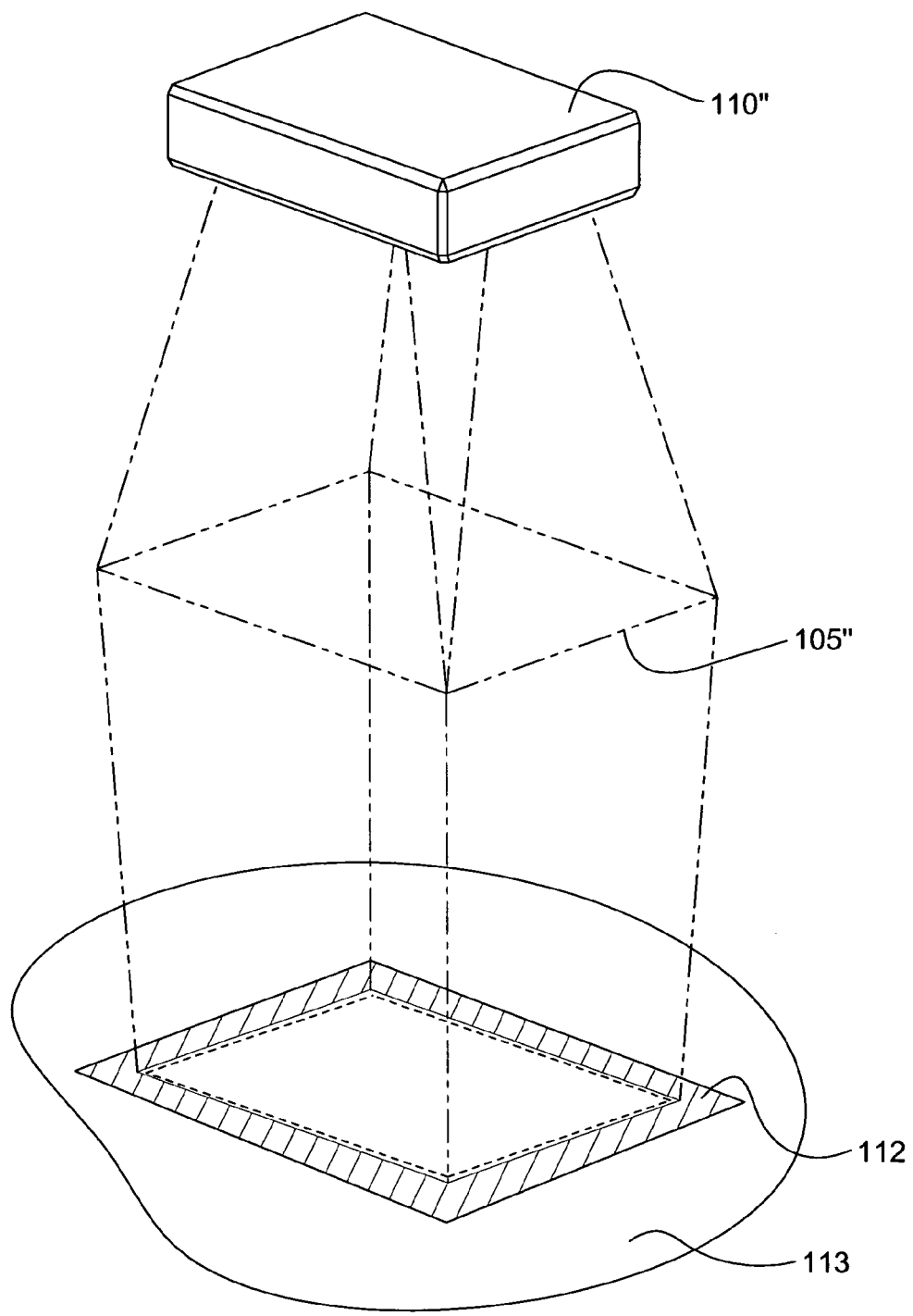
FIG. 3 is a perspective front view of an illustrative embodiment of an overhead 3D omni-directional holographic laser scanning system 100" according to the present invention, including visible markings 112 that are affixed to a surface 113 over which the objects are moved through the 3-D scanning volume 105" and that provide visible indicia characterizing the location of the 3-D scanning volume 105" (and the 3-D omni-directional scan pattern therein) of system 100".

FIG. 3 illustrates an exemplary embodiment of an overhead 3-D omni-directional holographic laser scanning system 100" according to the present invention including visible markings 112 affixed to a surface 113 over which the objects are moved. Such visible markings 112 characterize location (and general spatial boundaries) of the 3-D scanning volume 105" (and the 3-D omni-directional scanning pattern therein), for example, by providing an indication of the approximate location of the edges of the 3-D scanning volume 105" as shown. Alternatively, such visible markings 112 may characterize location (and general spatial boundaries) of the 3-D scanning volume 105" (and the 3-D omni-directional scanning pattern therein) by providing an indication of the approximate location of the center of the 3-D scanning volume 105" and/or of any other portion of the 3-D scanning volume 105". Such visible markings 112 may be visible tape (such as reflective or bright colored tape) or may be visible paint (such as reflective or bright colored paint) applied to the surface 113.

In another embodiment of the 3-D omni-directional holographic laser scanning system of the present invention, the laser scanning beam(s) used by the system to detect properties (such as bar-code symbols affixed thereto) of surfaces passing through the 3-D scanning volume may be used to provide such visible indicia. For example, such visible indicia may be provided by controlling the 3-D omni-directional holographic laser scanning system to repeatably scan select scan lines that pass through the 3-D scanning volume thereby providing a pulsing of such select scan lines in a manner that provides a characterization of location (and general spatial boundaries) of the 3-D scanning volume (and the 3-D omni-directional scanning pattern therein) that is visibly discernable to users of the system. The pulsing of such select scan lines may characterize location (and general spatial boundaries) of the 3-D scanning volume (and the 3-D omni-directional scanning pattern therein) by providing an indication of the approximate location of the center of the 3-D scanning volume, of one or more edges of the 3-D scanning volume, and/or of any other portion of the 3-D scanning volume.

The 3-D omni-directional holographic laser scanning system of the present invention may utilize holographic scanning discs supporting holographic optical elements in generating the omni-directional scanning pattern, as taught in WIPO Publication No. WO 97/22945, herein incorporated by reference in its entirety. An exemplary holographic laser scanning system 100-A of the present invention is illustrated in detail in FIGS. 4(A)–(F). Preferably, the omni-directional scan pattern produced by the holographic laser scanning system 100-A includes different multi-directional scan patterns at varying focal zones (e.g., focal planes) within the 3-D scanning volume. Moreover, such multiple focal zones may cover a depth of field greater than one foot (and preferably cover a depth of field greater than one meter). In addition, the 3-D scanning volume of the omni-directional scan pattern (produced by the holographic laser scanning system 100-A) is preferably characterized by a well-defined boundary comprised of substantially planar polygonal surfaces (as illustrated in FIGS. 2(A) and 2(B)).

The exemplary holographic laser scanning system utilizes multi-faceted holographic optical elements to direct a 3-D omni-directional scan pattern of outgoing laser light through the 3-D scanning volume and collect the incoming light for capture by the optical detector(s). The 3-D scanning volume contains an omni-directional laser scanning pattern having different scan patterns over five focal zones, which are formed by five laser scanning stations indicated as LS1, LS2, LS3, LS4 and LS5 in FIG. 4(A), arranged about a sixteen-facet holographic scanning disc 130 (illustrated in greater detail in FIG. 4(D)). The scanning pattern projected within the middle (third) focal zone (e.g., focal plane) of the holographic laser scanning system is shown in FIG. 4(F).

In general, the scan pattern and scan speeds for the holographic laser scanning system can be designed and constructed using the methods detailed in U.S. Pat. Nos. 6,158,659, 6,085,978, 6,073,846, and 5,984,185, all commonly assigned to the assignee of the present invention and each herein incorporated by reference in their entirety. The design parameters for each sixteen facet holographic scanning disc shown in FIG. 4(D), and the supporting subsystems used therewith, are set forth in detail in the above-referenced US Patents.

Figure 4A:
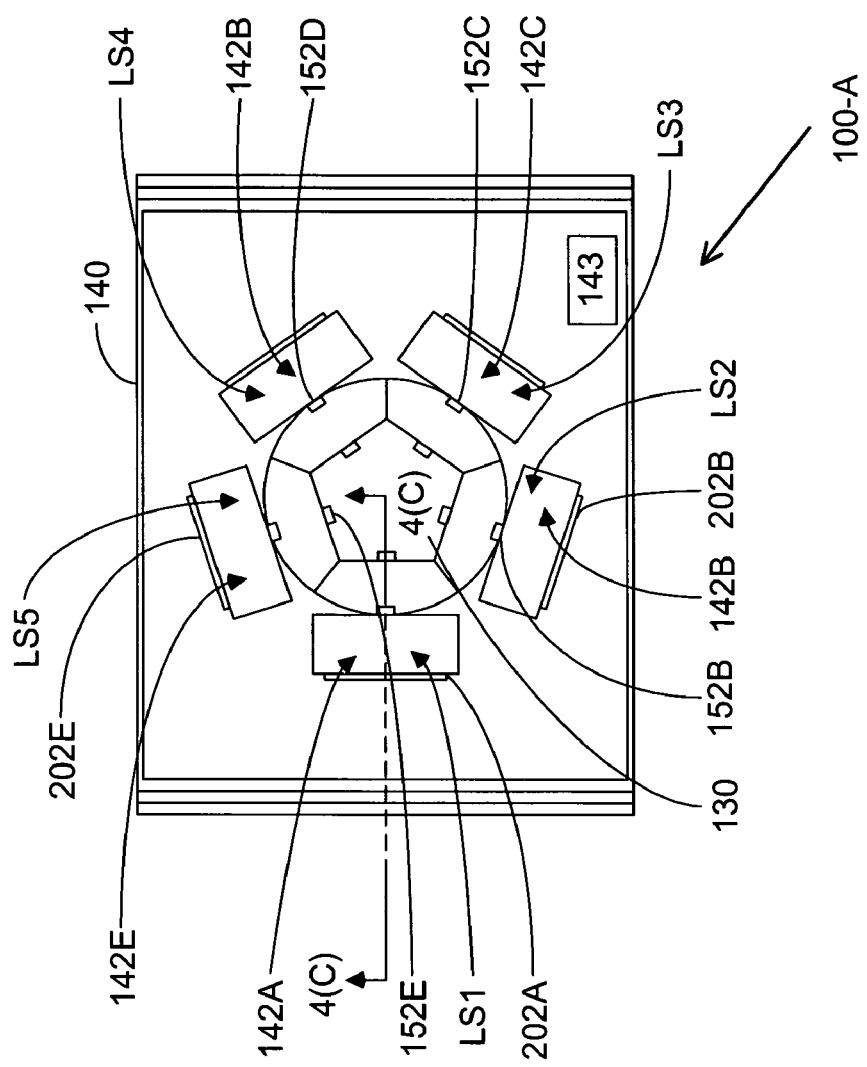
FIG. 4(A) is a schematic illustration of a top view of an exemplary holographic laser scanning system 100-A of the present invention, which produces an omni-directional laser scanning pattern having different multi-directional scan patterns at multiple focal zones (e.g., multiple focal planes) in a 3-D scanning volume which are formed by five laser scanning stations (indicated as LS1, LS2, LS3, LS4 and LS5) arranged about a sixteen-facet holographic scanning disc 130.

As described in WIPO Publication No. WO 97/22945, the holographic laser scanning system 100-A employed herein cyclically generates from its compact scanner housing 140 shown in FIG. 4(A), a complex three-dimensional laser scanning pattern within a well defined 3-D scanning volume. In this illustrative embodiment, such a laser scanning pattern is generated by a rotating holographic scanning disc 130, about which are mounted five (5) independent laser scanning stations, sometime referred to as laser scanning modules by Applicants. In FIG. 4(A), these laser scanning stations are indicated by LS1, LS2, LS3, LS4 and LS5.

Figure 4B:
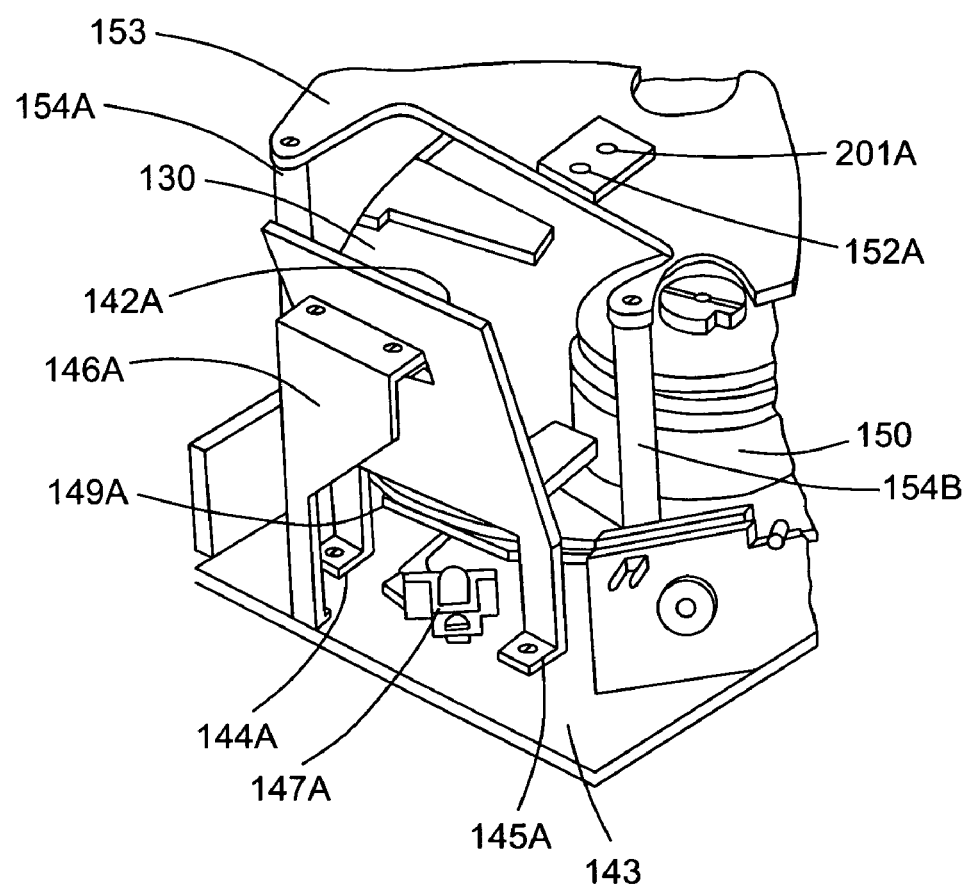
FIG. 4(B) is a schematic illustration of one (LS1) of the laser scanning stations of the holographic laser scanning system 100-A of the present invention, as illustrated in FIG. 4(A), including a laser beam production module 147A mounted on an optical bench; and a beam folding mirror 142A associated with the laser scanning station L1, having a substantially planar reflective surface and tangentially mounted adjacent to the holographic scanning disc 130.

In FIG. 4(B), one of the laser scanning stations in the holographic scanning system 100-A is shown in greater detail. For illustration purposes, all subcomponents associated therewith shall be referenced with the character "A", whereas the subcomponents associated with the other four laser scanning stations shall be referenced using the characters B through E. As illustrated in FIG. 5(B), a beam folding mirror 142A associated with the laser scanning station L1, has a substantially planar reflective surface and is tangentially mounted adjacent to the holographic scanning disc 130. In the illustrative embodiment, beam folding mirror 142A is supported in this position relative to the housing base (i.e. the optical bench) 143 using support legs 144A and 145A and rear support bracket 146A.

As shown in FIG. 4(B), the laser scanning station L1 includes a laser beam production module 147A mounted on the optical bench (i.e. housing base plate 143). The laser beam production module 147A is preferably mounted on the optical bench 143 immediately beneath its associated beam folding mirror 142A.

As shown in FIG. 4(A), the five laser production modules 142A through 142E are mounted on base plate 143, substantially but not exactly symmetrically about the axis of rotation of the shaft of electric motor 150. During laser scanning operations, these laser beam production modules produce 5 independent laser beams which are directed through the edge of the holographic disc 130 at an angle of incidence $A_i$, which, owing to the symmetry of the laser scanning pattern of the illustrative embodiment, is the same for each laser scanning station (i.e. $A_i$=43.0 degrees for values of i). The incident laser beams produced from the 5 laser beam production modules 142A through 142E extend along the five central reference planes, each extending normal to the plane of base plate 143 and arranged about 72 degrees apart from its adjacent neighboring central planes. While these central reference planes are not real (i.e. are merely virtual), they are useful in describing the geometrical structure of each laser scanning station in the holographic laser scanning system 100-A of the present invention.

The facets of rotating the scanning disk 130 diffract the incident light beams (produced from the laser beam production modules 147A . . . 147E) and directs the diffracted light beams onto the associated light bending mirrors 142A . . . 142E, which directs the diffracted light beams through the 3-D scanning volume, thereby producing a 3-D omni-directional scanning pattern. The middle (third) focal zone (i.e., focal plane) of this 3-D omni-directional scanning pattern is shown in FIG. 4(F).

As shown in FIG. 4(B), the laser scanning station L1 includes at least one photodetector (e.g. a silicon photocell) 152A mounted along its central reference plane, above the holographic disc 130 and opposite its associated beam folding mirror 142A so that it does not block or otherwise interfere with the returning (i.e. incoming) light rays reflecting off light reflective surfaces (e.g. product surfaces, bar code symbols, etc) during laser scanning and light collecting operations.

In the illustrative embodiment, the photodetectors 152A through 152E are supported in their respective positions by a photodetector support frame 153, which is stationarily mounted to the optical bench by way of vertically extending support elements (two shown as 154A and 154B). The electrical analog scan data signal produced from each photodetector 152A through 152E is processed in a conventional manner by its analog scan data signal processing circuitry 201A through 201E, which may be supported upon the photodetector support frame as shown. The analog scan data signal processing circuitry 201A may be realized as an Application Specific Integrated Circuit (ASIC) chip, which is suitably mounted with the photodetector 152A onto a small printed circuit (PC) board, along with electrical connectors which allow for interfacing with other boards within the scanner housing. With all of its components mounted thereon, each PC board may be suitably fastened to the photodetector support frame 153, along its respective central reference frame, as shown in FIG. 5(B).

Notably, the height of the photodetector support frame 153, referenced to the base plate (i.e. optical bench), is chosen to be less than the minimum height so that the beam folding mirrors must extend above the holographic disc in order to realize the pre-specified laser scanning pattern of the illustrative embodiment. In practice, this height parameter is not selected (i.e. specified) until after the holographic disc has been completely designed according to the design process of the present invention, while satisfying the design constraints imposed on the disc design process. As explained in detail in WIPO Publication No. WO 97/22945, the use of a spreadsheet-type computer program to analytically model the geometrical structure of both the laser scanning apparatus and the ray optics of the laser beam scanning process, allows the designer to determine the geometrical parameters associated with the holographic scanning facets on the disc which, given the specified maximum height of the beam folding mirrors $Y_j$, will produce the pre-specified laser scanning pattern (including focal plane resolution) while maximizing the use of the available light collecting area on the holographic scanning disc.

Figure 4C:
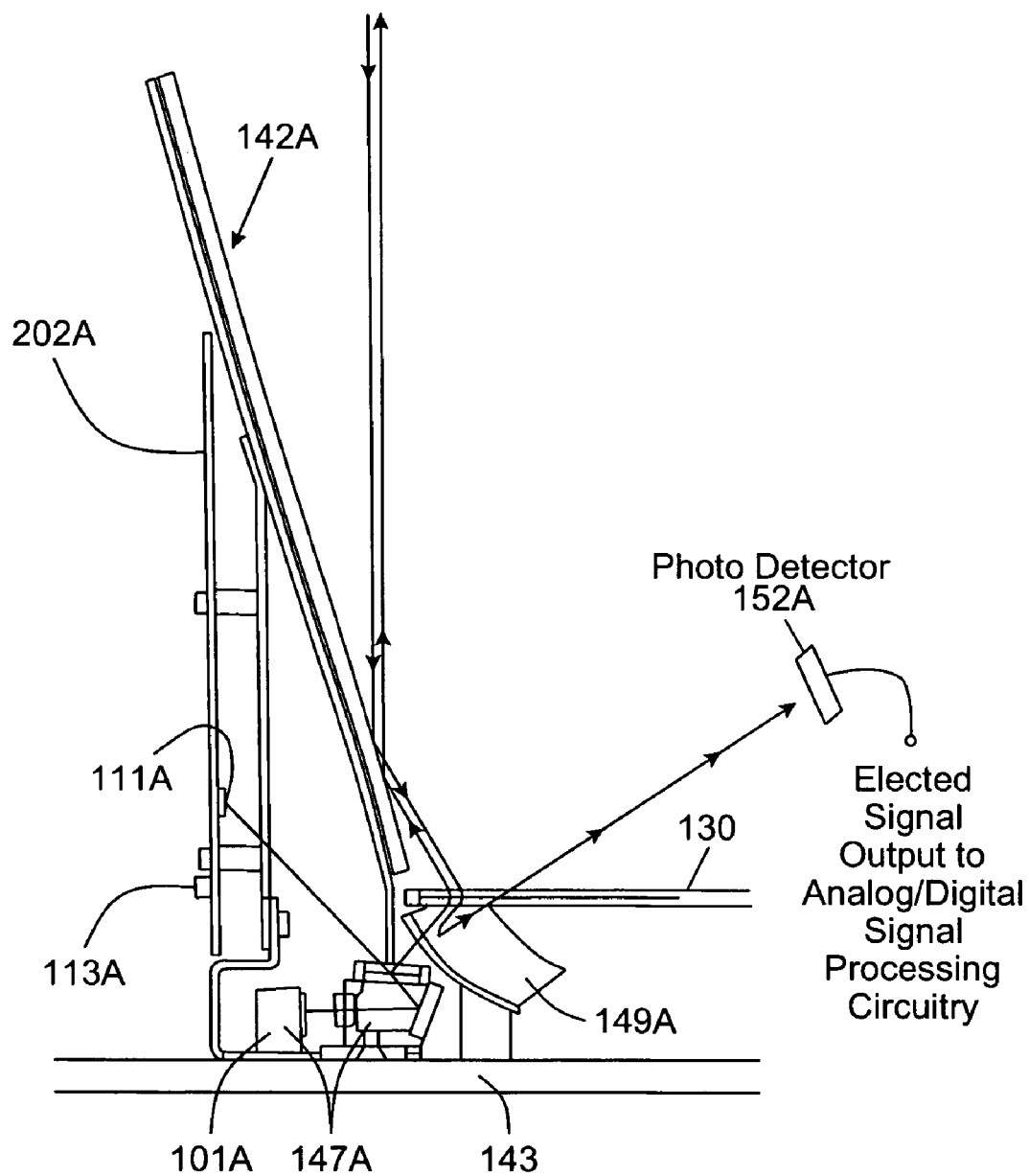
FIG. 4(C) is a schematic illustration of a cross-section of the holographic laser scanning system 100-A of the present invention as illustrated in FIGS. 4(A) and 4(B), wherein facets of rotating the scanning disk 130 diffract incident light beams (produced from the laser beam production module 147A) and direct the diffracted light beams onto the associated light bending mirrors 142A, which directs the diffracted light beams through the 3-D scanning volume, thereby producing a 3-D omni-directional scanning pattern with multiple focal zones; at least one photodetector (e.g., a silicon photocell) 152A is mounted along the central reference plane of the laser scanning station LS1, above the holographic disc 130 and opposite its associated beam folding mirror 142A so that it does not block or otherwise interfere with the returning (i.e., incoming) light rays reflecting off light reflective surfaces (e.g., product surfaces, bar code symbols, etc.) during laser scanning and light collecting operations; the electrical analog scan data signal produced from the photodetector 152A (and other photodetectors 152B . . . 152E) is processed to detect properties (such as detecting and decoding bar code symbols on surfaces of objects) of the surfaces; the parabolic light collecting mirror 149A of the laser scanning station L1 is disposed beneath the holographic scanning disc 130, along the central reference plane associated with the laser scanning station LS1; the light collecting mirror 149A collects incoming light rays reflected off the surfaces (e.g., bar code symbols affixed thereto) and passing through the holographic facet (producing the corresponding instant scanning beam) onto the parabolic light collected mirror 149A, and focuses such collected light rays through the same holographic facet onto the photodetector associated with the laser scanning station.
Figure 4D:
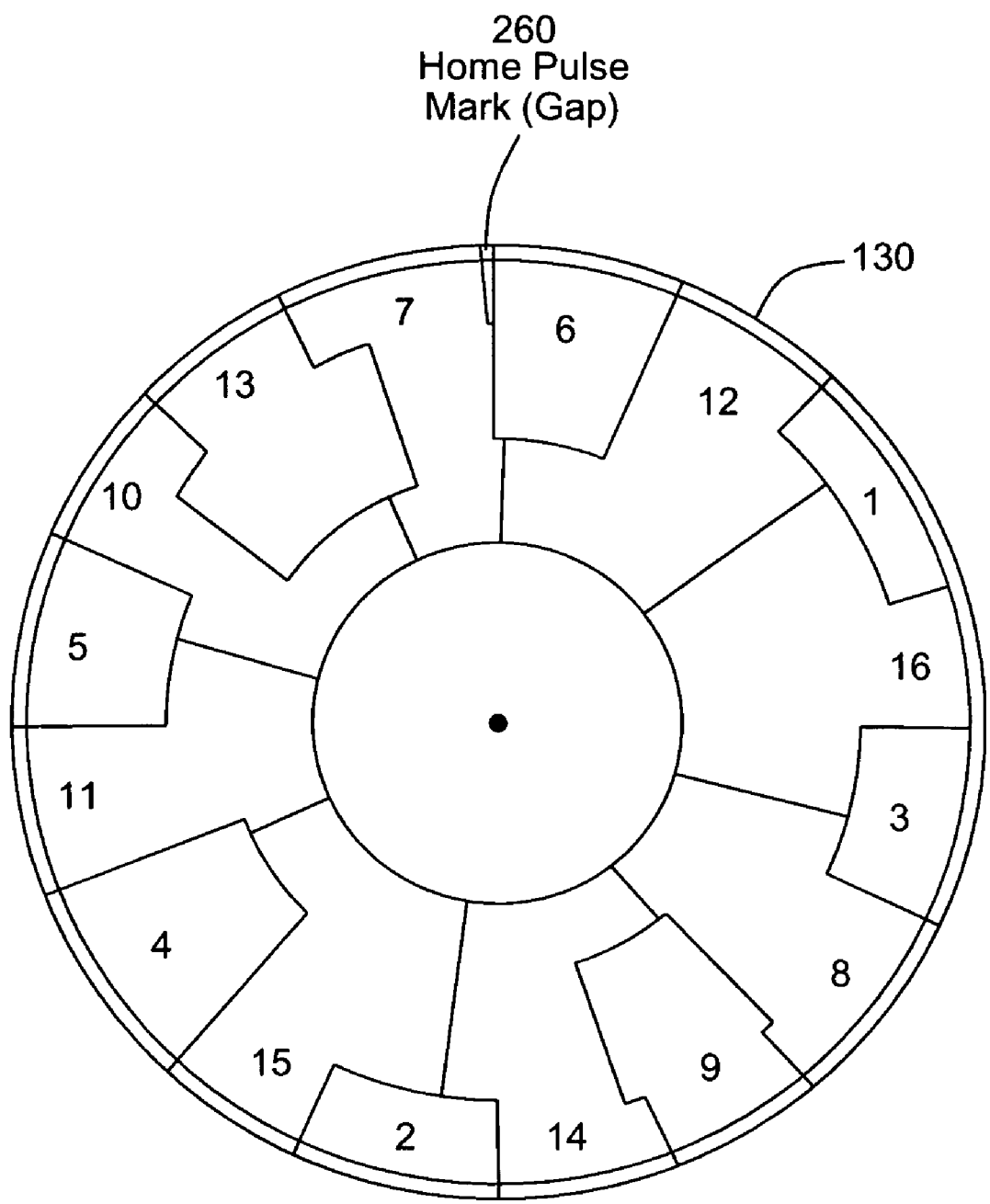
FIG. 4(D) is a schematic illustration of the scanning disk 130 of the holographic laser scanning system 100-A of the present-invention as illustrated in FIGS. 4(A), 4(B) and 4(C).

As best shown in FIG. 4(C), the parabolic light collecting mirror 149A of the laser scanning station L1 is disposed beneath the holographic scanning disc 130, along the central reference plane associated with the laser scanning station. While certainly not apparent from this figure, precise placement of the parabolic light collecting element (e.g. mirror) 149A relative to the holographic facets on the scanning disc 130 is a critical requirement for effective light detection by the photodetector (152A) associated with each laser scanning station L1. Placement of the photodetector 152A at the focal point of the parabolic light focusing mirror alone is not sufficient for optimal light detection in the light detection subsystem of the present invention. As taught in WIPO Publication No. WO 97/22945, careful analysis must be accorded to the light diffraction efficiency of the holographic facets on the scanning disc and to the polarization state(s) of collected and focused light rays being transmitted therethrough for detection. As will become more apparent hereinafter, the purpose of such light diffraction efficiency analysis ensures the realization of two important conditions, namely: (i) that substantially all of the incoming light rays reflected off an object (e.g. surface, or bar code symbol affixed thereto) and passing through the holographic facet (producing the corresponding instant scanning beam) are collected by the parabolic light collecting mirror 149A; and (ii) that all of the light rays collected by the parabolic light collecting mirror 149A are focused through the same holographic facet onto the photodetector associated with the station, with minimal loss associated with light diffraction and refractive scattering within the holographic facet. A detailed procedure is described in WIPO Publication No. WO 97/22945 for designing and installing the parabolic light collecting mirror 149A in order to satisfy the operating conditions for effective light collection and detection as described above.

The optical scan data signal $D_0$ focused onto the photodetector 152A during laser scanning operations is produced by light rays of a particular polarization state (e.g., S polarization state) associated with a diffracted laser beam being scanned across a light reflective surface (e.g. the bars and spaces of a bar code symbol) and scattering thereof. Typically, the polarization state distribution of the scattered light rays is altered when the scanned surface exhibits diffuse reflective characteristics. Thereafter, a portion of the scattered light rays are reflected along the same outgoing light ray paths toward the holographic facet(s) on the scanning disc 130 which produced the scanned laser beam. These reflected light rays are collected by these facet(s) and ultimately focused onto the photodetector 152A by its parabolic light reflecting mirror 149A disposed beneath the scanning disc 130. The function of each photodetector 152A is to detect variations in the amplitude (i.e. intensity) of optical scan data signal $D_0$, and to produce in response thereto an electrical analog scan data signal $D_1$ which corresponds to such intensity variations. When a photodetector with suitable light sensitivity characteristics is used, the amplitude variations of electrical analog scan data signal $D_0$ will linearly correspond to the light reflection characteristics of the scanned surface (e.g. the scanned bar code symbol). The function of the analog signal processing circuitry 201A is to filter and amplify the electrical analog scan data signal $D_0$, in order to improve the signal-to-noise ratio (SNR) of the signal $D_1$ for output to digital signal processing circuitry, which is preferably mounted on PC board 202A that is disposed behind the beam folding mirror 142A of the laser scanning station L1 as shown in FIG. 4(C).

The digital signal processing circuitry, which is preferably mounted on the PC board 202A as shown in FIG. 4(C), preferably operates to convert the analog scan data signal $D_1$ output by the-analog signal processing circuitry into a corresponding digital scan data signal $D_2$, and processes the digital scan data signal $D_2$ to extract information (such as symbols or bar codes) related to surfaces of objects passing through the 3-D scanning volume based upon the characteristics of the reflected light encoded by the digital scan data signal $D_2$.

The digital signal processing circuitry preferably includes A/D conversion circuitry that converts the analog scan data signal $D_1$ output by the analog signal processing circuitry into a corresponding digital scan data signal $D_2$ having first and second (i.e. binary) signal levels which correspond to the bars and spaces of the bar code symbol being scanned. Preferably, the A/D conversion circuitry performs a thresholding function on a second-derivative zero-crossing signal in generating the digital scan data signal $D_2$. In practice, the digital scan data signal $D_2$ appears as a pulse-width modulated type signal as the first and second signal levels thereof vary in proportion to the width of bars and spaces in the scanned bar code symbol.

In addition, the digital signal processing circuitry includes digitizing circuitry whose functions are two-fold: (1) to convert the digital scan data signal $D_2$, associated with each scanned bar code symbol, into a corresponding sequence of digital words (i.e. a sequence of digital count values) $D_3$ representative of package identification (I.D.) data; and (2) to correlate time-based (or position-based) information about the facet sector on the scanning disc 130 that generated the sequence digital words $D_3$ (corresponding to a scan line or portion thereof).

Notably, in the digital word $D_3$, each digital word represents the time length duration of first or second signal level in the corresponding digital scan data signal $D_2$. Preferably, the digital words $D_3$ are in a digital format suitable for use in carrying out various symbol decoding operations which, like the scanning pattern and volume of the present invention, will be determined primarily by the particular scanning application at hand.

In addition, the digital signal processing circuitry includes symbol decoding circuitry that primarily functions to receive the digital word sequence $D_3$ produced from its respective digitizing circuitry, and subject it to one or more bar code symbol decoding algorithms in order to determine which bar code symbol is indicated (i.e. represented) by the digital word sequence $D_3$.

Reference is made to U.S. Pat. No. 5,343,027 to Knowles, herein incorporated by reference in its entirety, as it provides technical details regarding the design and construction of circuitry suitable for use in the holographic laser scanning system 100-A of the present invention.

In addition, the digital signal processing circuitry may generate information that specifies a vector-based geometric model of the laser scanning beam (and possibly plane-sector) that was used to collect the scan data underlying the decode bar code symbol. Such information may be used with "3-D ray tracing techniques" to derive the position of the decoded bar code symbol in the 3-D scanning volume as described in detail in co-pending U.S. patent application Ser. No. 09/157,778, filed Sep. 21, 1998, co-pending U.S. patent application Ser. No. 09/327,756 filed Jun. 7, 1999, and International Application PCT/US00/15624, filed Jun. 7, 2000, all commonly assigned to the assignee of the present invention and herein incorporated by reference in their entirety.

In addition, the analog (or digital) signal processing circuitry may include a plurality of pass-band filter stages corresponding to different focal zones (or different scan ranges) in the 3-D scanning volume. Each pass-band filter stage is designed with particular high (and low) cut-off frequencies that pass the spectral components of the analog scan data signal produced when a bar code symbol is scanned at the corresponding focal zone (or scan range), while limiting noise outside the particular spectral pass-band of interest. When a bar code symbol is scanned by a laser beam focused within a particular focal zone in the 3-D scanning volume, the pass-band filter stage corresponding to the particular focal zone (or particular scan range) is automatically switched into operation so that the spectral components of the analog scan data signal within the particular spectral pass-band are present, while noise outside the particular spectral pass-band is limited. This selective filtering enables the signal processing circuitry to generate first and second derivative signals (which are processed to produce a corresponding digital scan data signal as described above) that are substantially free from the destructive effects of thermal and substrate noise that are outside the spectral pass-band of interest for the bar code symbol being scanned. A more detailed description of such selective filtering mechanisms (and laser scanning systems that employ such mechanisms) is described in U.S. patent application Ser. No. 09/243,078 filed Feb. 2, 1999, and U.S. application Ser. No. 09/442,718 filed Nov. 18, 1999, herein incorporated by reference in their entirety.

Figure 4E:
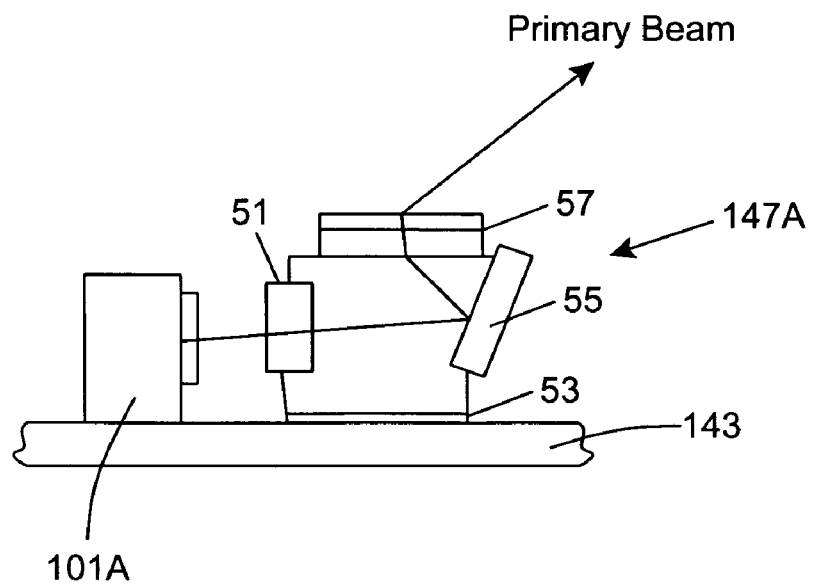
FIG. 4(E) is a schematic illustration of a laser production module for one (LS1) of the laser scanning stations of the holographic laser scanning system 100-A of the present invention, as illustrated in FIGS. 4(A), 4(B) and 4(C), including: a visible laser diode (VLD) 101A; an aspheric collimating lens 51, supported within the bore of a housing 53 mounted upon an optical bench 143 of the module housing, for focusing the laser light produced by the VLD 101A; a mirror 55, supported within the housing 53, for directing the focused laser light produced by lens 51 to a multi-function light diffractive grating 57 supported by the housing 53; the multi-function light diffractive grating 57, which has a fixed spatial frequency and is disposed at an incident angle relative to the outgoing laser beam provided by the mirror 55, and produced a primary beam that is directed towards the facets of the rotating scanning disk 130; and the multi-function light diffractive grating 57, which changes the properties of the incident laser beam so that the aspect ratio of the primary beam is controlled, and beam dispersion is minimized upon the primary laser beam exiting the holographic scanning disc 13.
Figure 4F:
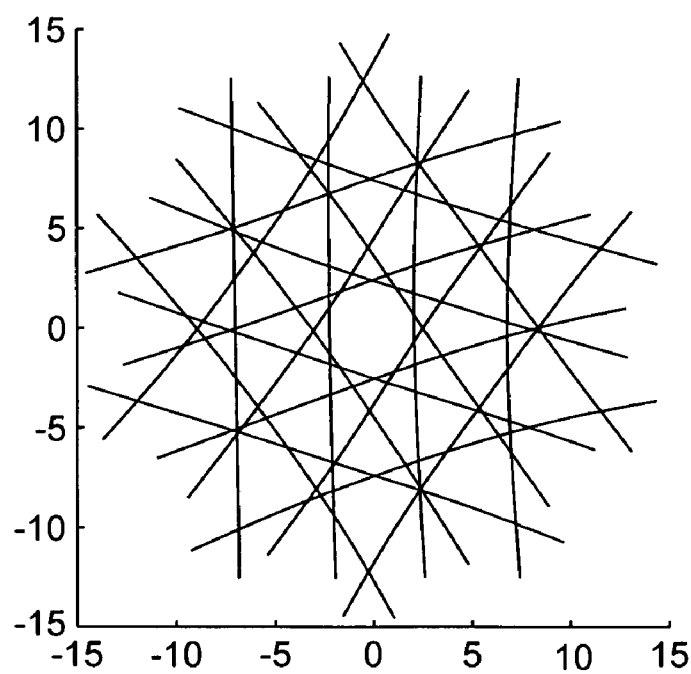
FIG. 4(F) is a schematic illustration of the middle focal plane of the omni-directional scanning pattern produced by the holographic laser scanning system 100-A of the present invention as illustrated in FIGS. 4(A), 4(B) and 4(C).

FIG. 4(E) illustrates an exemplary embodiment of the laser production modules 147A of FIGS. 4(B) and 4(C) including: a visible laser diode (VLD) 101A, an aspheric collimating lens 51 supported within the bore of a housing 53 mounted upon the optical bench 143 of the module housing for collimating (e.g., focusing) the laser light produced by the VLD 101A; a mirror 55, supported within the housing 53, for directing the focused laser light produced by lens 51 to a multi-function light diffractive grating 57 (sometimes referred to by Applicants as "multi-function HOE" or "multi-function plate") supported by the housing 53. The multi-function light diffractive grating 57, having a fixed spatial frequency and disposed at incident angle relative to the outgoing laser beam provided by the mirror 55, produces a primary beam that is directed toward the facets of the rotating scanning disk 130. The multi-function light diffractive grating 47 changes the properties of the incident laser beam so that the aspect ratio of the primary beam is controlled, and beam dispersion is minimized upon the primary laser beam exiting the holographic scanning disc 130. Details for designing the multi-function light diffractive grating 57 and configuring the laser scanning beam module 147A of the illustrative embodiment is described in greater detail in Applicants' prior U.S. patent application Ser. No. 08/949,915 filed Oct. 14, 1997, and incorporated herein by reference in its entirety.

In addition, the holographic laser scanning system 100-A includes laser drive circuitry (not shown) which generates the electrical signals for driving the VLD 101A of the respective laser beam production modules 147A, 147B, . . . 147E. The laser drive circuitry for a respective VLD may be disposed on the PC board 202 (shown in FIG. 4(C) as PC board 202A for the VLD 101A in laser beam production module 147A).

In addition, the holographic laser scanning system 100-A preferably includes a control board (not shown) disposed with the housing 140 onto which is mounted a number of components mounted on a small PC board, namely: a programmed controller with a system bus and associated program and data storage memory, for controlling the system operation of the holographic laser scanner system 1090A and performing other auxiliary functions; serial data channels (for example, RS-232 channels) for receiving serial data input from the symbol decoding circuitry described above; an input/output (I/O) interface circuit 248 for interfacing with and transmitting symbol character data and other information to an I/O subsystem (which may be operably coupled to a data management computer system); home pulse detector, including a photodetector and associated circuitry, for detecting the home pulse generated when the laser beam from a VLD (in home pulse marking sensing module) is directed through home-pulse gap 260 (for example, between Facets Nos. 6 and 7 on the scanning disk 130 as shown in FIG. 4(D)) and sensed by the photodetector; and a home-offset-pulse (HOP) generator, which is preferably realized as an ASIC chip, for generating a set of home-offset pulses (HOPs) in response to the detection of each home pulse by the home pulse detector. The programmed controller produces motor control signals, and laser control signals during system operation that enable motor drive circuitry to drive the scanning disc motor coupled to holographic scanning disc 130 and enable the laser drive circuitry to drive the VLDs of the laser beam production modules 247A, 247B, . . . 247E, respectively. A more detailed description of the control board and its respective components are disclosed in co-pending U.S. patent application Ser. No. 09/047,146 filed Mar. 24, 1998, co-pending U.S. patent application Ser. No. 09/157,778, filed Sep. 21, 1998, co-pending U.S. patent application Ser. No. 09/327,756 filed Jun. 7, 1999, co-pending U.S. patent application Ser. No. 09/551,887 filed Apr. 18, 2000, International Application No. PCT/US99/06505 filed Mar. 24, 1999, and International Application PCT/US00/15624, filed Jun. 7, 2000, all commonly assigned to the assignee of the present invention and herein incorporated by reference in their entirety.

According to the present invention, the holographic laser scanning system 100-A includes visible indicia characterizing location (and general spatial boundaries) of the 3-D scanning volume (and the 3-D omni-directional scan pattern therein) that is visibly discernable to users of the holographic laser scanning system. Such visible indicia may be one or more visible light beams (visibly discernable to users of the holographic laser scanning system) that provide a visible light pattern characterizing location (and general spatial boundaries) of the 3-D scanning volume (and the 3-D omni-directional scan pattern therein). Alternatively, such visible indicia may be visible markings (visibly discernable to users of the holographic laser scanning system), such as reflective paint or reflective tape, affixed to a surface (over which objects are moved through the 3-D scanning volume) in a manner that characterizes location (and general spatial boundaries) of the 3-D scanning volume (and the 3-D omni-directional scan pattern therein). Such visible indicia may characterize location (and general spatial boundaries) of the 3-D scanning volume (and the 3-D omni-directional scan pattern therein) by providing an indication of the approximate location of the center of the 3-D scanning volume, of one or more edges of the 3-D scanning volume, and/or of any other portion of the 3-D scanning volume. A more detailed description of such mechanisms is described above with respect to FIGS. 2(A), 2(B) and 3. Such visible indicia enable users to quickly identify the correct location of the 3-D scanning volume (and the 3-D omni-directional scan pattern therein) when attempting to transport the object through the 3-D scanning volume, thus limiting unwanted scanning errors and increasing the productivity of the user, which represents decreased costs associated with the use of the holographic laser scanning system.

In another embodiment of the 3-D omni-directional holographic laser scanning system of the present invention, such visible indicia may be generated by controlling the system to repeatably scan select scan lines that pass through the 3-D scanning volume thereby providing a pulsing of such select scan lines in a manner that provides a characterization of location (and general spatial boundaries) of the 3-D scanning volume (and the 3-D omni-directional scan pattern therein) that is visibly discernable to users of the system. The pulsing of such select scan lines may characterize location (and general spatial boundaries) of the 3-D scanning volume (and the 3-D omni-directional scan pattern therein) by providing an indication of the approximate location of the center of the 3-D scanning volume, of one or more edges of the 3-D scanning volume, and/or of any other portion of the 3-D scanning volume. In the illustrative holographic laser scanning system 100-A as described above, the home pulse detector (and timing signals derived therefrom) may be used to control the pulsing of select scan lines in a manner that provides a characterization of location of the 3-D scanning volume (and the 3-D omni-directional scan pattern therein) that is visibly discernable to users of the system.

The improved 3-D omni-directional holographic laser scanning system of the illustrative embodiments of the present invention as set forth above may include an additional mechanism that indicates when a user enters the 3-D scanning volume (or a region proximate thereto) and provides the user with visible (or audio) feedback in response thereto. Such a mechanism may employ one or more infrared detection beams that sweep the 3-D scanning volume to detect when a user enters the 3-D scanning volume (or a region proximate thereto). Upon detection, the mechanism generates a visual signal (such as flashing light) and/or an audio signal that indicates that the user is inside (or outside) the 3-D scanning volume (or the region proximate thereto). In the event that the system employs a "good read" audio (and/or visual) indicator, such "good read" indicator is preferably distinguishable from the signals that indicate that the user is inside (or outside) the 3-D scanning volume (or the region proximate thereto). In addition, the mechanism that indicates when a user enters the 3-D scanning volume (or a region proximate thereto) may be used to selectively activate (or deactivate) generation of the visible light pattern that characterizes location of the 3-D scanning volume (and the 3-D omni-directional scanning pattern therein) in response thereto.

The improved 3-D omni-directional holographic laser scanning system of the illustrative embodiments of the present invention as described above can be used in various types of applications, such as for example, in package handling applications where bar codes are read to determine (a) identification of incoming packages, (b) identification of outgoing packages, and (c) to provide user instructions in manually routing and sorting packages based upon the information encoded by the bar codes. Moreover, the laser scanning system of the illustrative embodiments of the present invention as described above can read virtually any bar code symbology imaginable (e.g. Interleaved two of five, Code 128 and Code three of nine) and formats so as to sort and identify packages at various package rates required by USPS or other end-users, ZIP Codes (six digits), Package Identification Codes (PIC) (sixteen characters) and Tray bar code (ten digits) symbols.

For example, the housing of the improved 3-D omni-directional holographic laser scanning system of the illustrative embodiments as described above may be mounted to a base that can be moved (and locked) into different spatial positions overhead one or more manual package scanning, sorting and routing stations (e.g., a station at the end of a slide, a station adjacent a conveyor belt, a station adjacent a transport container or bin, or a station adjacent a transport vehicle such as truck or van). It is contemplated that a rolling track or a multi-cantilever arm (similar to the arm used to position a light in a dentist's office) may be used to move (and lock) the 3-D omni-directional holographic laser scanning system into the desired spatial position overhead such stations.

Moreover, the improved 3-D omni-directional holographic laser scanning system of the illustrative embodiments of the present invention as described above can process all types of products (e.g. trays and tubs having extremely large variance in surface types, colors, and plastics (e.g. Tyvek material, canvass, cardboard, polywrap, Styrofoam, rubber, dark packages). Some of these product types include: soft pack pillows, bags; packages having non-flat bottoms, such as flats, trays, and tubs with and without bands; cartons; rugs; duffel bags (without strings or metal clips); tires; wooden containers; and sacks.

It is understood that the laser scanning systems, modules, engines and subsystems of the illustrative embodiments may be modified in a variety of ways which will become readily apparent to those skilled in the art, and having the benefit of the novel teachings disclosed herein. All such modifications and variations of the illustrative embodiments thereof shall be deemed to be within the scope and spirit of the present invention as defined by the Claims to Invention appended hereto.

The invention claimed is:

1. A method of automatically identifying packages during manual package sortation operations, comprising the steps of:
   (a) supporting a laser scanning system above a workspace environment of 3-D spatial extent occupied by a human operator involved in the manual sortation of packages bearing bar code symbols, said laser scanning system including a housing having a light transmission aperture, and a laser scanning pattern generator disposed within said housing;
   (b) projecting from said laser scanning pattern generator, and through said light transmission aperture, a laser scanning pattern substantially confined within the spatial extent of a predefined 3-D scanning volume and spatially encompassing a substantial portion of said workspace environment;

(c) projecting from a visible scanning-zone indication pattern generator, a visible scanning-zone indication pattern onto a floor surface immediately beneath said workspace environment so as to provide a visible indication of points substantially corresponding to the boundary of the projection of said laser scanning pattern onto said floor surface;

(d) said human operator using said visible scanning-zone indication pattern to help guide the transport of a package bearing a bar code symbol through said predefined 3-D scanning volume so that said laser scanning pattern automatically reads the bar code symbol on said package, and said laser scanning system automatically produces symbol character data representative of said read bar code symbol and the identity of said package; and (e) manually sorting said package identified during step (d) within said workspace environment.

2. The method of claim 1, wherein step (b) further comprises: projecting an omnidirectional laser scanning pattern from said laser scanning pattern generator, wherein said omnidirectional laser scanning pattern further comprises a plurality of focal planes definable relative to said housing, and said omnidirectional laser scanning pattern consists of a plurality of scanlines disposed within each said focal plane for scanning the bar code symbol on said package as said package is transported through said predefined 3-D scanning volume.

3. The method of claim 1, wherein step (a) comprises supporting said laser scanning system above said workspace environment, wherein said laser scanning pattern generator includes:

a plurality of laser beam sources for producing a plurality of laser beams;

a holographic scanning disc, rotatable about an axis of rotation, and supporting a plurality of holographic optical elements for scanning and focusing said plurality of laser beams so as to produce a plurality of scanning planes;

a plurality of beam folding mirrors disposed about said holographic scanning disc, for folding said plurality of scanning planes so as to project an omnidirectional laser scanning pattern through said light transmission aperture and within the spatial extent of said predefined 3-D scanning volume;

a plurality of light focusing elements disposed beneath said holographic scanning disc, each said light focusing element focusing towards a focal point above said holographic scanning disc, light rays reflected off said scanned bar code symbol and collected by said holographic optical elements; and a plurality of photodetectors, each said photodetector being proximately disposed at one said focal point above said holographic scanning disc, and being radially aligned with the optical axis of one of said light focusing elements, for directly detecting the intensity of focused light rays retransmitted through said holographic optical elements as said holographic scanning disc rotates, and generating a scan data signal for subsequent processing and conversion into said symbol character data.

4. The method of claim 3, wherein each said light focusing element is realized as a parabolic mirror element.

5. The method of claim 3, wherein said plurality of laser beam sources comprises a plurality of visible laser diodes.

6. The method of claim 3, wherein step (c) comprises projecting said visible scanning-zone indication pattern from said visible scanning-zone indication pattern generator which comprises apparatus for producing a visible light pattern that characterizes the spatial location of the boundary of the projection of said omni-directional laser scanning pattern onto said floor surface.

7. The method of claim 6, wherein during step (c) said visible light pattern comprises light emitted from one of at least one white light source, at least one light-emitting diode, and at least one visible laser diode.

8. The method of claim 6, wherein during step (c) said visible light pattern is pulsed.

9. The method of claim 8, wherein said visible light pattern is pulsed at a frequency less than the critical flicker frequency.

10. A system for automatically identifying packages during manual package sortation operations, comprising:

a laser scanning system supported above a workspace environment of 3-D spatial extent occupied by a human operator involved in the manual sortation of packages bearing bar code symbols, said laser scanning system including
a housing having a light transmission aperture,
a laser scanning pattern generator disposed within said housing, for projecting through said light transmission aperture, a laser scanning pattern substantially confined within the spatial extent of a predefined 3-D scanning volume that spatially encompasses a substantial portion of said workspace environment occupied by said human operator, and
a visible scanning-zone indication pattern generator for projecting a visible scanning-zone indication pattern onto a floor surface immediately beneath said workspace environment so as to provide a visible indication of points substantially corresponding to the boundary of the projection of said laser scanning pattern onto said floor surface, wherein said human operator can use said visible scanning-zone indication pattern to visually guide the transport of a package bearing a bar code symbol through said predefined 3-D scanning volume, so that said laser scanning pattern automatically reads the bar code symbol on said package, and said laser scanning system automatically produces symbol character data representative of said read bar code symbol and the identity of said package, and thereafter, said package can be manually sorted by said human operator within said workspace environment.

11. The system of claim 10, wherein said laser scanning pattern further comprises a plurality of focal planes definable relative to said housing, and said laser scanning pattern consists of a plurality of scanlines disposed within each said focal plane for repeatedly scanning the bar code symbol on said package as said package is transported through said predefined 3-D scanning volume.

12. The system of claim 10, wherein said laser scanning pattern generator comprises:

a plurality of laser beam sources for producing a plurality of laser beams;

a holographic scanning disc, rotatable about an axis of rotation, and supporting a plurality of holographic optical elements for scanning and focusing said plurality of laser beams so as to produce a plurality of scanning planes;

a plurality of beam folding mirrors disposed about said holographic scanning disc, for folding said plurality of scanning planes so as to project an omnidirectional laser scanning pattern through said light transmission aperture and within the spatial extent of said predefined 3-D scanning volume;

a plurality of light focusing elements disposed beneath said holographic scanning disc, each said light focusing element focusing towards a focal point above said holographic scanning disc, light rays reflected off said scanned bar code symbol and collected by said holographic optical elements; and a plurality of photodetectors, each said photodetector being proximately disposed at one said focal point above said holographic scanning disc, and being radially aligned with the optical axis of one of said light focusing elements, for directly detecting the intensity of focused light rays retransmitted through said holographic optical elements as said holographic scanning disc rotates, and generating a scan data signal for subsequent processing and conversion into said symbol character data.

13. The system of claim 12, wherein each said light focusing element is realized as a parabolic mirror element.

14. The system of claim 12, wherein said plurality of laser beam sources comprises a plurality of visible laser diodes.

15. The system of claim 3, wherein said visible scanning-zone indication pattern generator comprises apparatus for producing a visible light pattern that characterizes the spatial location of the boundary of the projection of said laser scanning pattern onto said floor surface.

16. The system of claim 15, wherein said visible light pattern comprises light emitted from one of at least one white light source, at least one light-emitting diode, and at least one visible laser diode.

17. The system of claim 15, wherein said visible light pattern is pulsed.

18. The system of claim 17, wherein said visible light pattern is pulsed at a frequency less than the critical flicker frequency.

* * * * *